United States Patent
Gilbert

(10) Patent No.: US 8,451,052 B2
(45) Date of Patent: May 28, 2013

(54) INSTRUMENTATION INPUT SYSTEMS

(75) Inventor: Barrie Gilbert, Beaverton, OR (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 13/330,388

(22) Filed: Dec. 19, 2011

(65) Prior Publication Data

US 2012/0086513 A1 Apr. 12, 2012

Related U.S. Application Data

(62) Division of application No. 12/500,581, filed on Jul. 9, 2009, now Pat. No. 8,098,094.

(60) Provisional application No. 61/079,431, filed on Jul. 9, 2008.

(51) Int. Cl.
*H03F 1/52* (2006.01)
*H03F 3/45* (2006.01)

(52) U.S. Cl.
USPC .............................. 330/11; 330/69; 330/207 P

(58) Field of Classification Search
USPC ................. 330/11, 69, 207 P, 144; 327/307
See application file for complete search history.

(56) References Cited

U.S. PATENT DOCUMENTS

| | | | |
|---|---|---|---|
| 3,308,392 A | | 3/1967 | McCarter |
| 3,436,673 A | * | 4/1969 | Fricke, Jr. .................. 330/51 |
| 4,559,503 A | | 12/1985 | Camand et al. |
| 5,572,166 A | | 11/1996 | Gilbert |
| 6,011,431 A | | 1/2000 | Gilbert |
| 6,753,727 B2 | | 6/2004 | Magoon et al. |
| 7,397,295 B2 | * | 7/2008 | Bicakci ..................... 327/307 |
| 2003/0151461 A1 | | 8/2003 | Arayashiki et al. |
| 2006/0267688 A1 | | 11/2006 | Tanoue et al. |
| 2007/0086548 A1 | | 4/2007 | Rawlins et al. |
| 2007/0290757 A1 | | 12/2007 | Gilbert et al. |

OTHER PUBLICATIONS

PCT International Search Report, PCT/US09/50179, Oct. 19, 2009.
PCT Written Opinion of the International Searching Authority, PCT/US09/50179, Oct. 19, 2009.

* cited by examiner

*Primary Examiner* — Steven J Mottola
(74) *Attorney, Agent, or Firm* — Marger Johnson & McCollom PC

(57) ABSTRACT

An input stage for an instrumentation system may include a resistor coupled between an input terminal and a summing node, and an amplifier arranged to maintain the voltage at the summing node. In anther embodiment, an instrumentation input system may include an input stage to receive a signal to be measured, and a variable gain amplifier having an input coupled to an output of the input stage, wherein the variable gain amplifier comprises two or more gain stages. A variable gain amplifier may include an attenuator having an input and a series of tap points and a series of low-inertia switches to steer outputs from the attenuator to an output terminal.

6 Claims, 12 Drawing Sheets

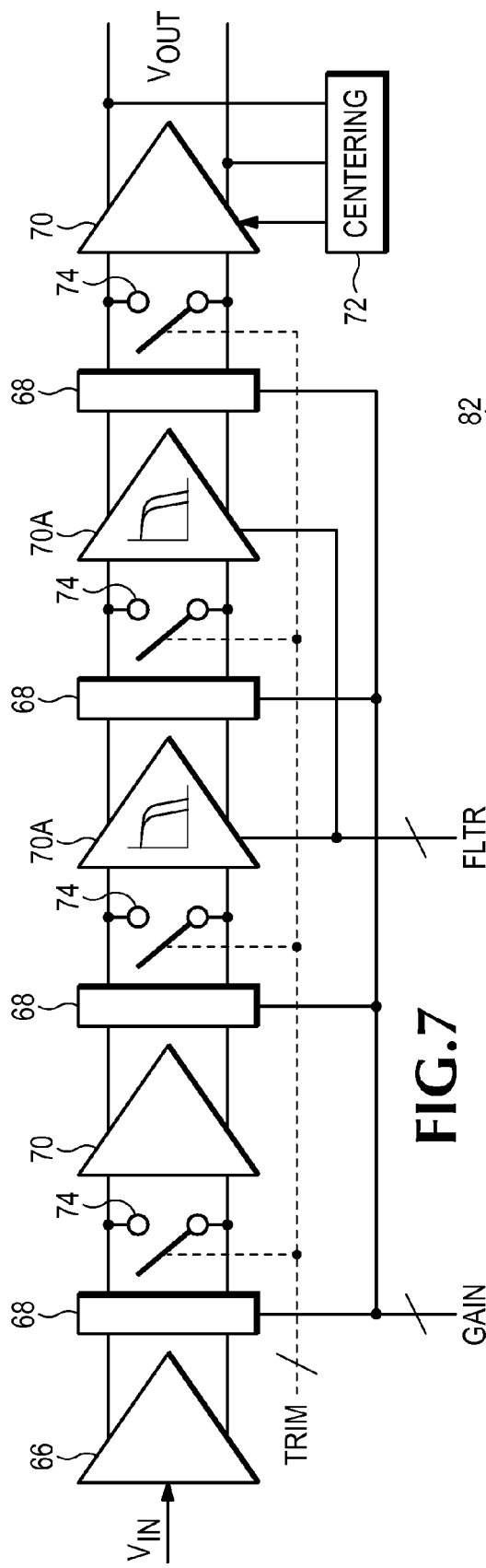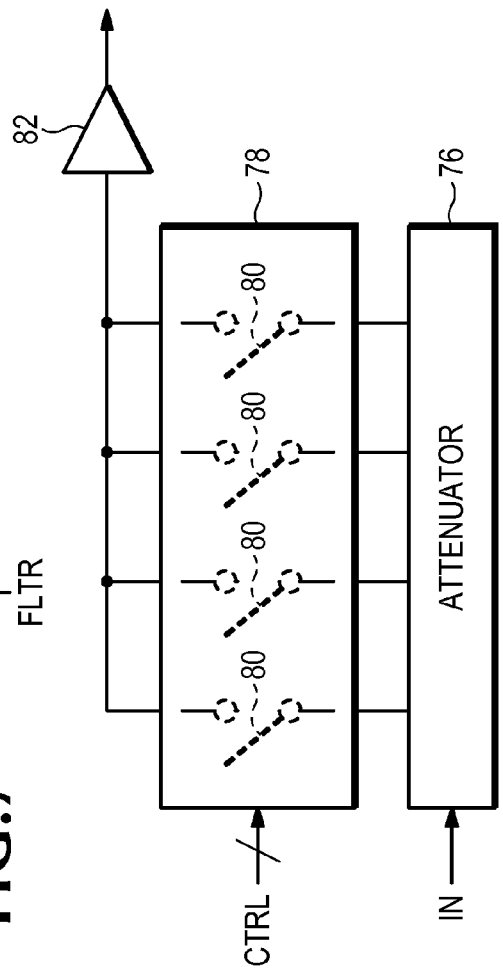

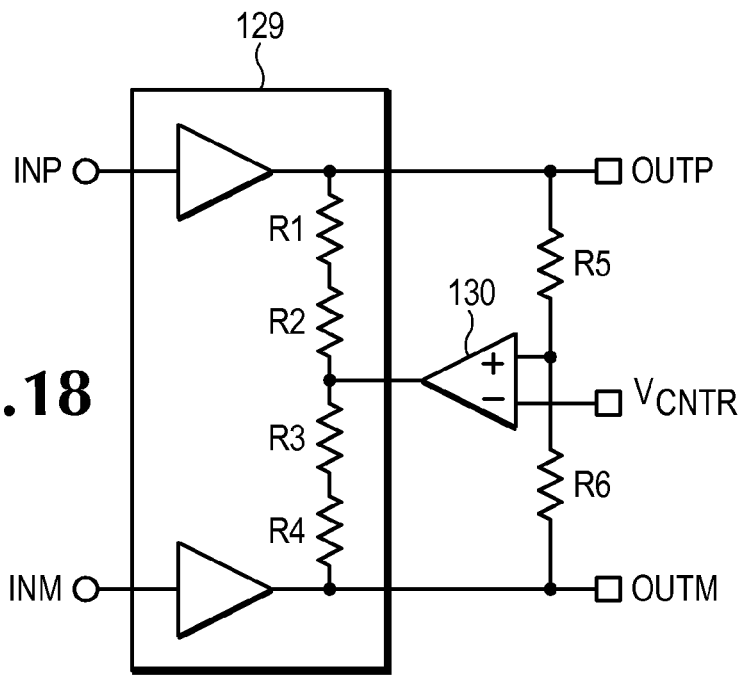
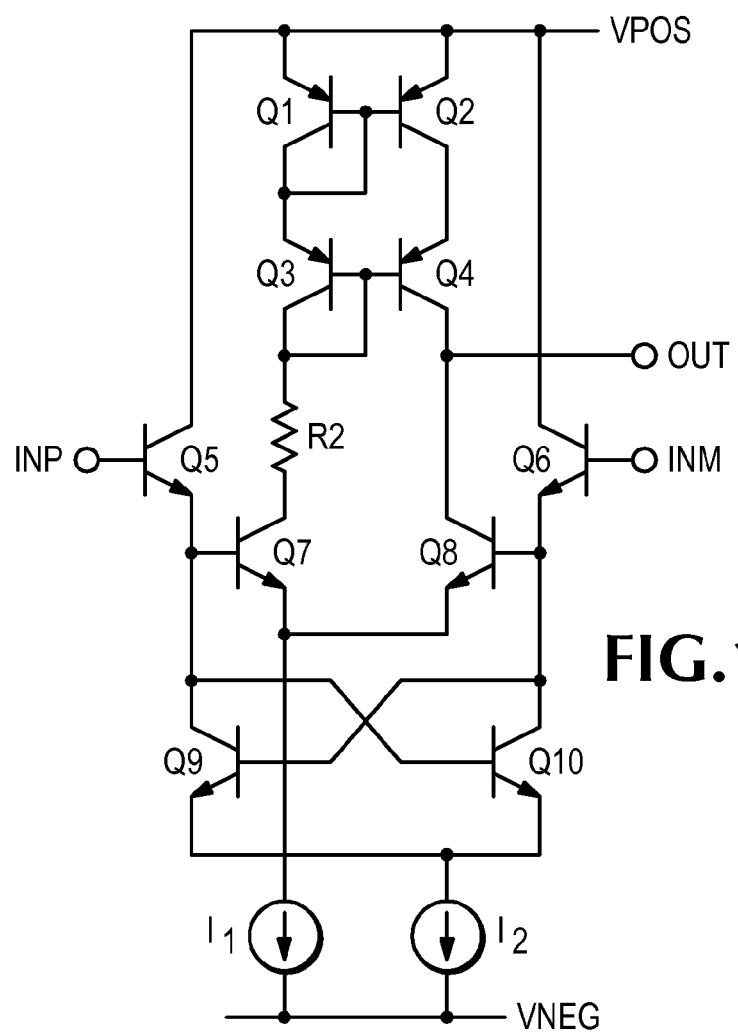

INSTRUMENTATION INPUT SYSTEMS

CROSS-REFERENCE TO RELATED APPLICATIONS

This application claims priority and is a divisional of U.S. patent application Ser. No. 12/500,581, titled Instrumentation Input Systems, filed Jul. 9, 2009, this application also claims benefit of U.S. Provisional Patent Application Ser. No. 61/079,431 filed Jul. 9, 2008 entitled Comprehensive Front-End For Instrumentation System, all of which is incorporated by reference.

BACKGROUND

FIG. 1 illustrates a prior art oscilloscope input circuit. The input signal is applied through a traditional BNC connector 10 to a unity-gain buffer amplifier 12 which typically has a field effect transistor (FET) input stage. The input signal is terminated by a 1MΩ resistor to ground which provides a defined input impedance. A variable capacitor $C_{ADJ}$ can be adjusted to trim the input capacitance. The circuit of FIG. 1 can be characterized as a voltage-mode circuit because the buffer amplifier directly measures the voltage across the termination resistor.

FET amplifiers are used because of their high sensitivity and high input impedance, which is generally beneficial when attempting to measure high-frequency, low-level signals. This sensitivity, however, makes them vulnerable to transient and overload conditions. Since oscilloscopes are used for research, development, testing, etc., they are necessarily connected to signal sources having unknown parameters. Such signal sources may apply transients measured in kilovolts (kV), as well as other types of extended overloads, to the input circuit. Therefore, a transient/overload protection circuit 14 must be included before the input amplifier. Protection circuits, however, are complicated and expensive. In fact, the cost and space consumed by protection circuitry tends to overwhelm that of the actual input measurement circuitry. Moreover, the protection circuitry tends to interfere with the normal operation of the measurement circuitry.

BRIEF DESCRIPTION OF THE DRAWINGS

FIG. 7 illustrates another embodiment of an instrumentation input system according to some inventive principles of this patent disclosure.

FIG. 8 illustrates an embodiment of a VGA circuit according to some inventive principles of this patent disclosure.

FIG. 18 illustrates another embodiment of a centering circuit according to some inventive principles of this patent disclosure.

FIG. 19 illustrates an embodiment of an op amp according to some inventive principles of this patent disclosure.

DETAILED DESCRIPTION

Input Circuits

Figure 1:
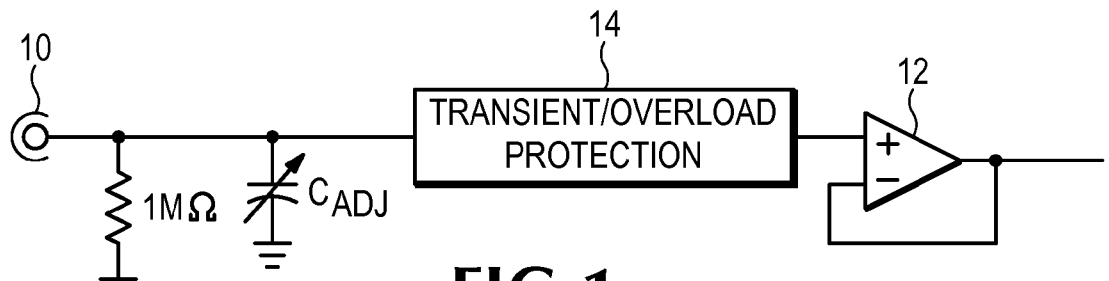
FIG. 1 illustrates a prior art oscilloscope input circuit.
Figure 2:
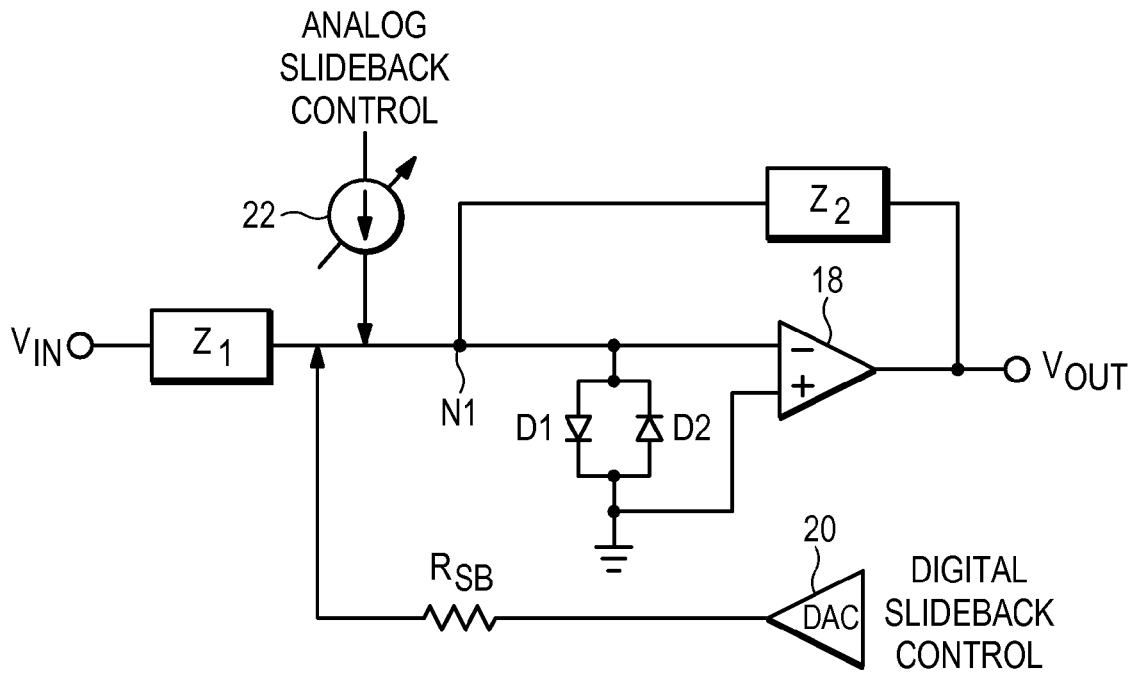
FIG. 2 illustrates an embodiment of an input circuit for an instrumentation system according to some inventive principles of this patent disclosure.

FIG. 2 illustrates an embodiment of an input circuit for an instrumentation system according to some inventive principles of this patent disclosure. The input signal $V_{IN}$ is applied to one end of a relatively large-valued impedance $Z_1$. The other end of $Z_1$ is connected to a summing node N1 at the inverting (−) input of an amplifier 18, which is preferably a high-sensitivity instrumentation grade operational amplifier such as a FET-input amplifier. Thus, the input voltage is immediately converted to a current that continues to flow through a feedback impedance $Z_2$, which for convenience, is assumed to have the same value as $Z_1$, but which may be any other suitable value.

The input to the configuration shown in FIG. 2 is inherently current-limited which provides a high level of protection from transient and overload conditions. Additional protection is provided by back-to-back diodes D1 and D2, preferably Schottky diodes, connected across the amplifier inputs. The input impedance, feedback impedance and/or additional compensation capacitors and RC networks can be implemented as either on-chip or external components.

A slideback feature can be provided by injecting an offset current into the summing node, which may be held at a virtual ground, using various techniques. For example, an offset can be provided by the variable current source 22 shown in FIG. 2, and/or digital slideback feature can be implemented by applying a digital word to a digital-to-analog converter 18 which then injects the offset into the summing node through another resistor $R_{SB}$. The configuration of FIG. 2 can provide a wide range of offset which is particularly useful for implementing a slideback feature on an oscilloscope to enable the user to view fine levels of detail in small signals that may be riding on top of much larger DC (or quasi-DC or pulse) signal levels.

Figure 3:
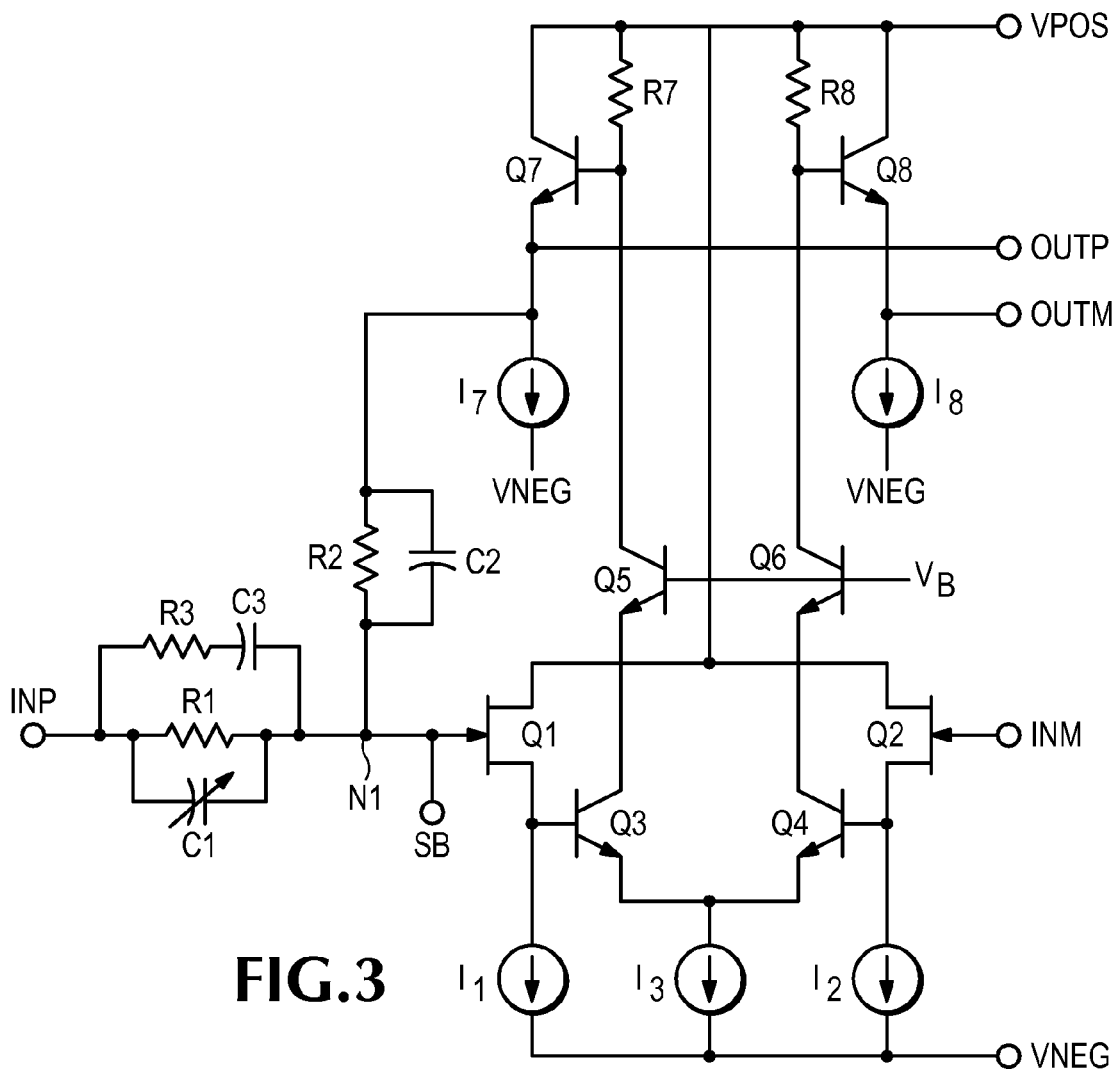
FIG. 3 illustrates another embodiment of an input circuit for an instrumentation system according to some inventive principles of this patent disclosure.

FIG. 3 illustrates another embodiment of an input circuit for an instrumentation system according to some inventive principles of this patent disclosure. The embodiment of FIG. 3 is especially well suited for use as a front end for an oscilloscope, but it may be adapted for use in any other types of instrumentation systems. The input signal is applied to the input terminal INP as a single-ended voltage. Resistor R1 converts the input to a current at summing node N1. Input resistor R1 sets the overall gain in combination with feedback resistor R2. The input amplifier includes JFET input transistors Q1 and Q2 which drive a differential pair Q3 and Q4 which, in turn, drive emitter follower transistors Q7 and Q8 through cascode transistors Q5 and Q6. Thus, a single ended input signal is converted to a well-balanced, fully differential output at OUTP and OUTM for further processing by a succeeding stage. This single-ended to differential conversion may be especially beneficial for systems in which the measured signal will be applied to an analog-to-digital converter (ADC) having a fully differential input. In some instrumentation systems, it may be advantageous to perform much of the signal processing in differential form, and the front-end circuit of FIG. 3 facilitates the conversion to differential form early in the signal processing path.

Another characteristic of the circuit of FIG. 3 is that it may not exhibit significant thermal tails. That is, when the input is overdriven, the circuit may recover quickly and may not exhibit significant overshoot or undershoot when the overload is removed.

Capacitor C2 provides feedback compensation. Capacitor C1 is shown as a variable capacitor that can be trimmed to adjust the HF compensation, for example, as a one-time on-chip adjustment. Resistor R3 and capacitor C3 may be included to provide additional compensation for extending the system bandwidth by making up for some of the bandwidth losses in the amplifier.

The values of R1 and R2 can be set to the final desired values, or they can be fabricated to facilitate user-adjustability. For example, if R1 and R2 are 1.5MΩ, the user can connect suitable resistors across the INP and SB terminals and the OUTP and SB terminals to accurately trim the input resistance to 1MΩ or other value that may be convenient for the input of an oscilloscope, while still maintaining the correct gain.

Any of the components including R1 and C1, R2 and C2 and R3 and C3 may be on-chip components, external components, or a combination of on-chip and external components.

The terminal SB at node N1 provides a convenient point for injecting an offset signal for slideback operation. Current sources $I_1$, $I_2$, $I_3$, $I_7$ and $I_8$ provide bias currents to transistors Q1, Q2, Q3-4, Q7 and Q8, respectively. Voltage $V_B$ may be any suitable anchor point for the cascode transistors Q5 and Q6. The other input terminal INM may be coupled to any suitable point such as a ground.

In some systems, the time constant $\tau_1$ of the input impedance of R1 and C1 may need to be equalized or otherwise coordinated with the time constant $\tau_2$ of the feedback impedance of R2 and C2 to provide acceptable dynamic response over a wide range of operating frequencies. This design consideration may be further complicated by the different constraints imposed on the fabrication of integrated circuits as compared to external components. For example, in an input system for an oscilloscope front-end, an equipment manufacturer may utilize a 1MΩ resistor having a one percent tolerance for R1. If R2 is fabricated on-chip, it may be exceedingly difficult and/or prohibitively expensive to trim R2 to the same tolerance, especially since a 1MΩ on-chip resistor would typically need to be extremely long and narrow. The system of FIG. 4 may provide a solution for calibrating an input circuit in a system that is subject to these types of disparate component constrains.

Figure 4:
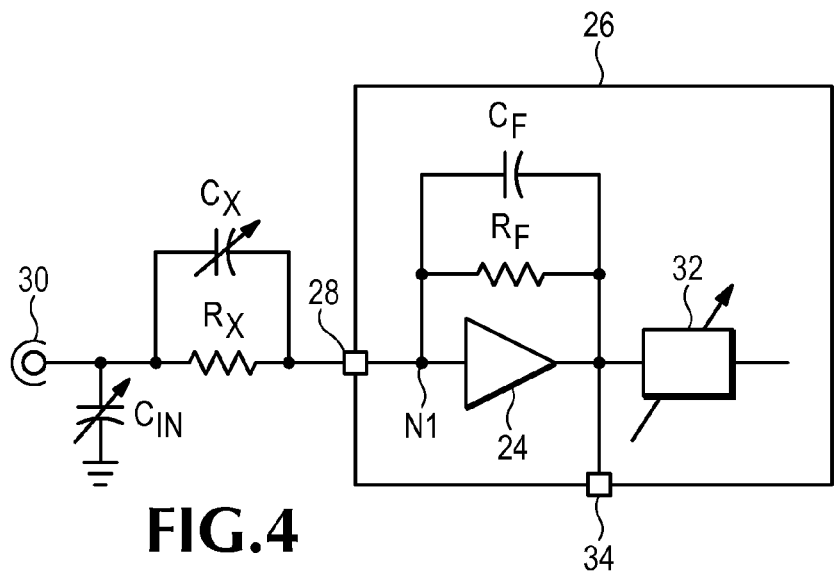
FIG. 4 illustrates an embodiment of an input circuit and calibration method according to some inventive principles of this patent disclosure.

FIG. 4 illustrates an embodiment of an input circuit and calibration method according to some inventive principles of this patent disclosure. In the embodiment of FIG. 4, an amplifier 24 is fabricated on an integrated circuit (IC) 26 along with a feedback network including resistor $R_F$ and capacitor $R_C$. The summing node N1 is brought out to a user-accessible terminal 28. The user may connect a resistor $R_X$ and a trimming capacitor $C_X$ in parallel between terminal 28 and a signal input such as a BNC connector 30. Another adjustable capacitor $C_{IN}$ may also be included to trim the input capacitance at the signal input. For purposes of this example, $R_F$ is assumed to have the same nominal value as $R_X$. Resistor $R_X$ is assumed to have a relatively tight tolerance, e.g., one percent. If the on-chip resistor $R_F$ has a wider tolerance, e.g., 30 percent, there will be a gain error caused by the value of $R_F$.

To compensate for the gain error, a gain adjustment stage 32 is included in the signal path, in this example, after the amplifier 24. The gain adjustment stage may be constructed to provide an adjustable amount of attenuation and/or amplification in response to any suitable input. For example, the amount of gain adjustment may be fixed at fabrication time by using any suitable IC trimming technique, or the adjustment may remain changeable over the life of the chip through the connection of external components. As one example, the gain adjustment stage may be based on a single-sided to differential stage similar to that shown in FIG. 3.

To set the amount of gain adjustment, a known sign may be applied to the input terminal 28 while observing the output of the amplifier and/or gain adjustment stage. The amount of gain adjustment may then be set to eliminate the gain error caused by the inaccuracy in $R_F$ and/or any other components. Once the gain error due to $R_F$ is removed, the external capacitor $C_X$ may be adjusted so the time constant of $R_X, C_X$ matches the time constant of $R_F, C_F$.

In an alternative embodiment, the on-chip resistor $R_F$ may have a value that is much different from the value of the external resistor $R_X$. For example, to reduce the large amount of die area that may be required for a 1MΩ resistor, $R_F$ may be fabricated as nominally 100KΩ, while the value of $R_X$ is remains 1MΩ. The gain at node N2 is $-R_F/R_X$, where $R_F$ is the unknown value of the on-chip resistor. As long as the gain adjustment stage 32 has enough gain, plus enough margin for the tolerance of $R_X$, the system will be able to accommodate the disparity in the values of $R_F$ and $R_X$.

The value of $C_F$ may need to be adjusted accordingly. For example, if $R_F$ is reduced by a factor of 10, $C_F$ may need to be increased by a factor of 10 to maintain the proper time constant. In some embodiments, the on-chip capacitor $C_F$ may be moved off-chip by making node N2 user accessible through another terminal 34.

A potentially beneficial characteristic of the embodiment of FIG. 4, is that, by partitioning the gain into two different gain stages, it may provide more gain-bandwidth than may otherwise be available from a single gain stage.

Input System Architecture

Figure 5:
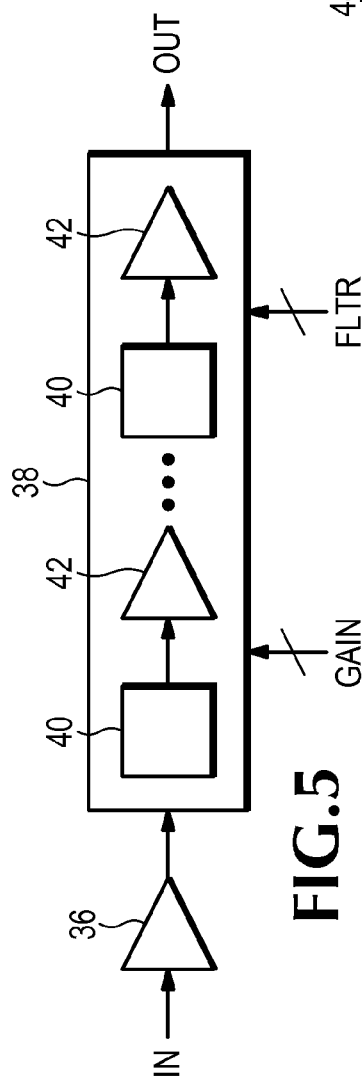
FIG. 5 illustrates an embodiment of an instrumentation input system according to some inventive principles of this patent disclosure.

FIG. 5 illustrates an embodiment of an instrumentation input system according to some inventive principles of this patent disclosure. An input stage 36 having a relatively high input impedance drives a variable gain stage 38 in response to an input signal IN. Rather than attempting to provide the entire gain range with a single variable gain amplifier (VGA), the gain range is broken up into several cascaded stages. The variable gain stage 38 includes a series of variable attenuators 40 and amplifiers 42 which generate an output signal OUT for further processing by the instrumentation systems in response to the signal received from the input stage. The gain of the variable gain stage 38 is controlled by one or more gain control signals GAIN. One or more filter control signals FLTR may be provided to control the frequency response of the variable gain stage 38.

The signals used throughout the embodiment of FIG. 5 may be realized in any suitable form, e.g., single-sided or differential, voltage or current mode, etc. The gain control and filter control functionality (if any) may also be realized in any suitable form, e.g., control may be continuous, in discrete steps, or a hybrid thereof; control signals may be analog, digital, hybrid, etc. The gain control functionality may be distributed throughout the attenuators and amplifiers in any suitable manner. For example, fixed attenuators may be used with variable amplifiers, variable attenuators may be used with fixed gain amplifiers, the gain control may be distributed between the attenuators and amplifiers with one providing coarse gain steps while the other provides fine gain steps, etc. Likewise, filter control functionality may be of any form, e.g., high pass, low pass, band pass, band reject, discrete steps, continuous control, hybrids thereof, etc. Filter functionality may also be distributed throughout the stages in any suitable manner. The components illustrated in FIG. 5 may be fabricated on a single integrated circuit (IC), distributed on multiple ICs, or fabricated using any other suitable technology.

Figure 6:
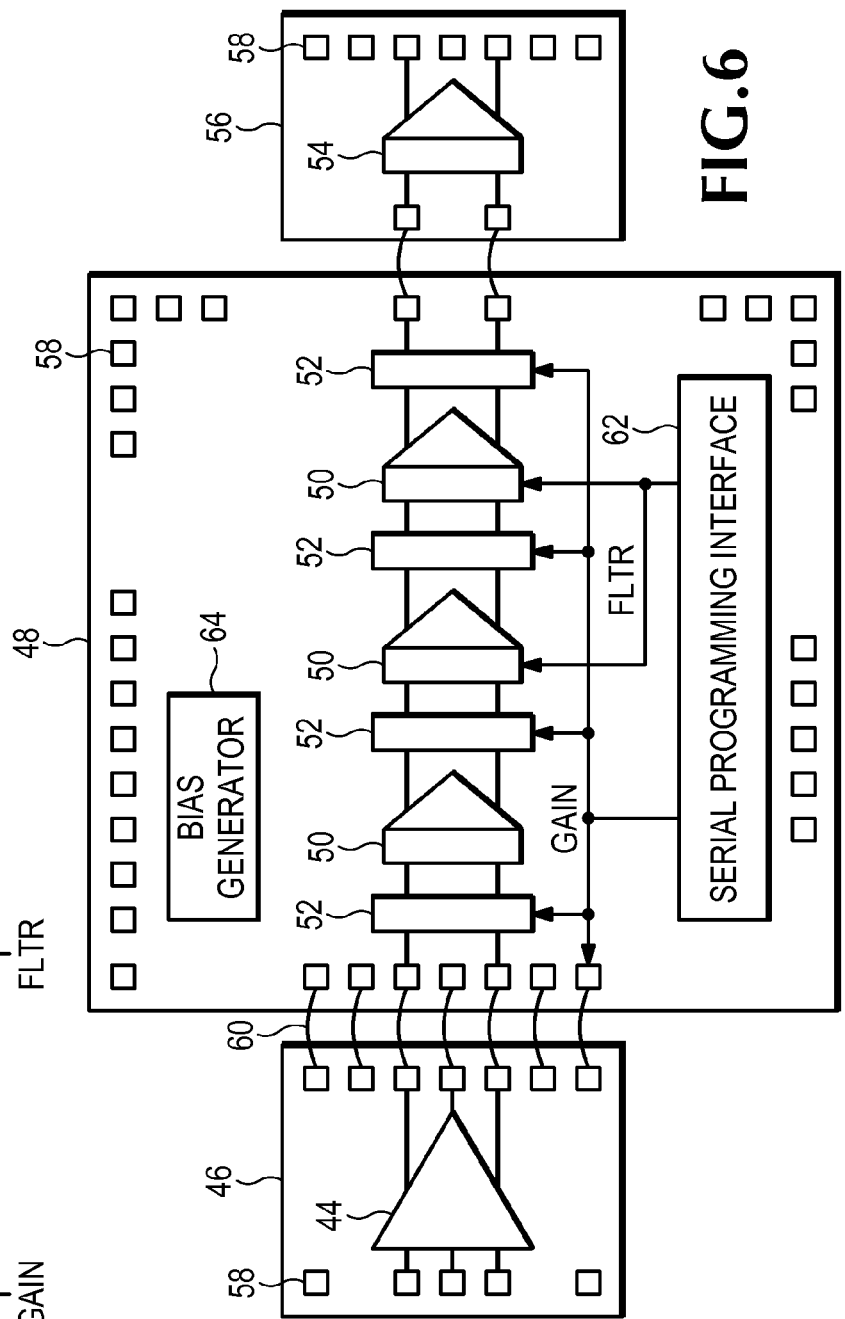
FIG. 6 illustrates another embodiment of an instrumentation input system according to some inventive principles of this patent disclosure.

FIG. 6 illustrates another embodiment of an instrumentation input system according to some inventive principles of this patent disclosure. In this example, a fixed gain input stage 44 is fabricated on a first IC 46. Variable gain is provided by a series of middle stages fabricated on a second IC 48. The middle stages include fixed gain main amplifiers 50 and digitally selectable variable attenuators 52. A fixed gain output stage 54 fabricated on a third IC 56 completes the signal path. Bond pads or other terminals 58 facilitate connections between the ICs as well as between the ICs and external circuitry through bondwires 60 and/or other connection methods.

A digital programming interface 62 generates one or more gain control signals GAIN that control the variable attenuators 52 in response to digital or analog gain control information received on one or more of the pads 58. The digital programming interface 62 also generates one or more filter control signals FLTR that control filter circuitry that is integral with the fixed gain amplifiers 50 in response to digital or analog gain control information received on one or more of the pads 58. As an example, the system may be arranged such that each attenuator from left to right provides progressively finer gain steps.

Bias generators 64 provide bias currents and other reference signals any of the circuitry on any of the ICs. Other functional blocks may be provided depending on the specific application. For example, if the system will be used for an oscilloscope, additional circuitry may be provided for auto slideback (including waveform mode select), trigger level pick-off (including slope/level programming), trigger mode, etc. The embodiment of FIG. 6 is shown with differential signal paths throughout, but single-sided signals may be used throughout the system, or in select portions.

The arrangement illustrated may provide several advantages depending upon the implementation. First, some instrumentation systems require high overall bandwidth. Breaking the VGA up into several stages may enable the system to achieve a higher gain-bandwidth product than could otherwise be achieved with a single stage. Second, by arranging the gain stages so that they are activated sequentially as the gain increases, a better signal-to-noise ratio (SNR) may be achieved than with a single VGA stage. Third, by splitting the VGA into stages, it may be easier to optimize each stage for a specific task, even going so far as to use different semiconductor technologies in a multi-chip configuration as shown in FIG. 6. For example, the input stage might be implemented on a GaAs, CMOS or BiCMOS chip having high quality field effect transistor (FETs), whereas the other stages are implemented in silicon chips, with all chips being mounted on a single header. All of the stages can be fabricated on a single chip, however, and many other configurations are possible. As a further example, the output stage can be optimized for driving an A/D converter.

Fourth, splitting the VGA into stages enables the gain selection function to be located where it is most beneficial. In this example, the variable gain is provided by three middle stages, but the variable gain functionality can alternatively or additionally be located in an input stage, output stage, etc. Moreover, coarse, medium, and fine gain increments can be distributed in any suitable manner; e.g., coarse gain steps in the center of the three middle stages, medium gain steps in the first of the three middle stages, and fine gain steps in the last of the three middle stages.

Fifth, the output from analog front-end circuitry in contemporary instrumentation systems is frequently coupled to an A/D converter for further processing and display in the digital domain. A/D converters require anti-aliasing filters at the input for proper operation, and higher-order filters are generally better. It may be relatively easy to include lower-order filters in individual stages, so by cascading multiple gain stages together, the overall result may be a very high-order filter which may be ideal for anti-aliasing purposes.

FIG. 7 illustrates another embodiment of an instrumentation input system according to some inventive principles of this patent disclosure. In this embodiment, the input stage 66 converts a single-sided signal $V_{IN}$ to a differential signal that is applied to a series of variable attenuators 68 and fixed gain amplifiers 70 and 70A. The variable attenuators are controlled by one or more gain control signals GAIN. Some of the amplifiers 70A are shown with a symbolic bode plot to indicate they have adjustable filtering characteristics that can be varied in response to one or more filter control signals FLTR. A centering circuit 72 enables a user to center the final output $V_{OUT}$ as may be needed for further processing. For example, the final output may need to be adjusted for the input of a particular ADC.

The embodiment of FIG. 7 is also shown with a series of switches 74 that effectively short-circuit the inputs to each of the amplifiers 70 and 70A. These switches may facilitate system calibration. In a cascade of multiple amplifiers, the amplifiers may have different offset voltages that are staggered in unpredictable ways. As the system gain changes, these offsets may add up to produce unacceptable inaccuracies. For example, in an oscilloscope application, staggered offsets may cause unacceptable changes in the DC balance as the gain is changed through various settings.

To eliminate this type of error, the switches 74 may be used to null the offsets of the amplifiers, either during fabrication and testing, or later after installation in a system. In an example embodiment, the last switch may be closed, and the offset of the final amplifier may be nulled by observing the output. The adjustment may be effected in any suitable manner, e.g., laser trimming resistors in a bias cell for the amplifier, adjusting a trimming potentiometer, etc. The final switch is then opened, and the next switch upstream is closed to enable nulling of the next amplifier upstream by observing the final output. This process may be repeated until the offsets of all of the amplifiers are nulled all the way to the first amplifier.

Variable Gain Amplifier with Low Inertia Steering

Figure 20:
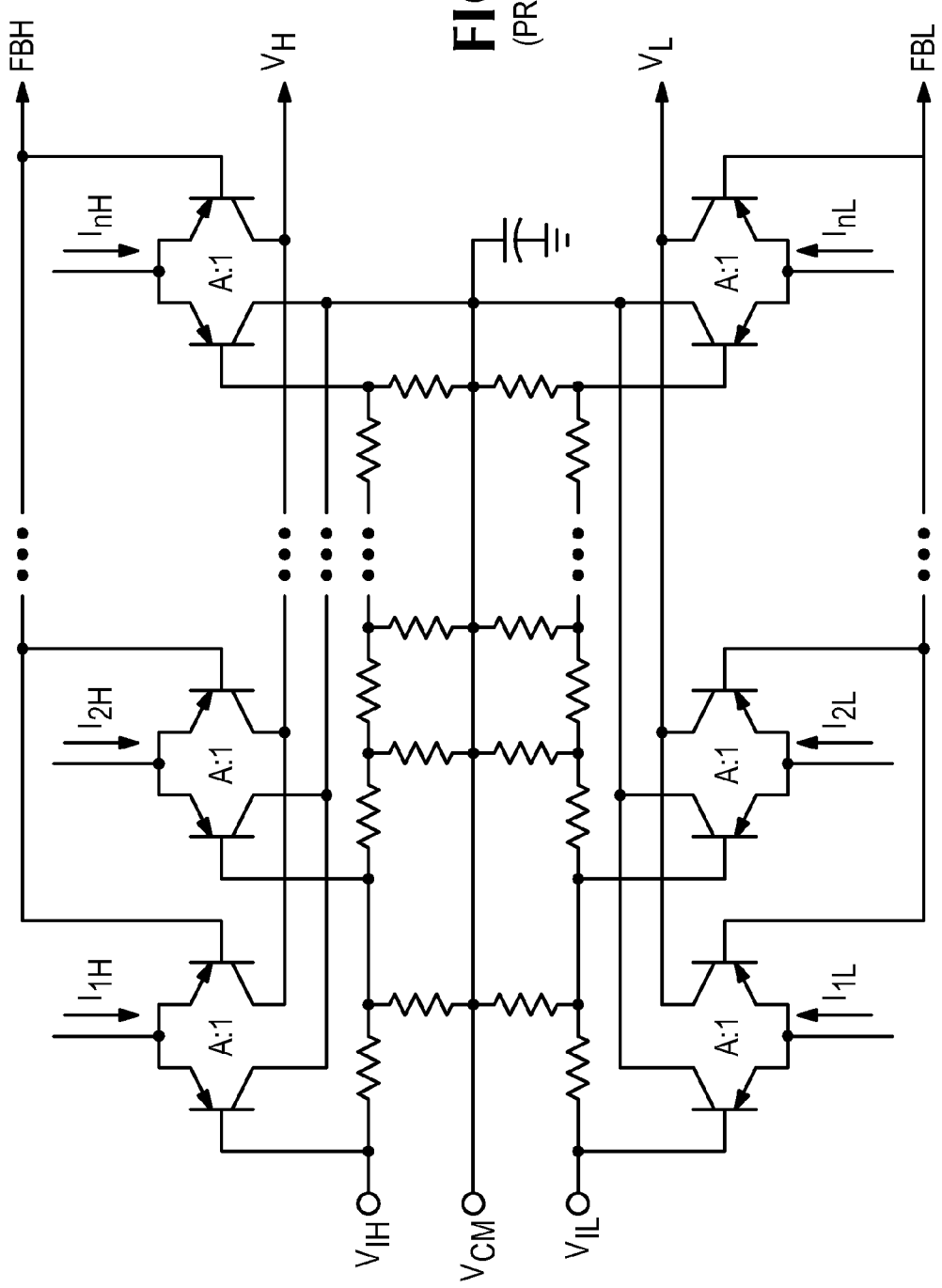
FIG. 20 illustrates a prior art variable gain amplifier.

FIG. 20 illustrates a prior art variable gain amplifier (VGA) in which the input signal $V_{IH}, V_{IL}$, is applied to the input of an attenuator that has multiple output taps, and continuously interpolated transconductance (gm) stages are used to steer outputs from one or more selected taps to a main amplifier. This general configuration is known as a continuously interpolated variable gain amplifier and sold under the brand name X-AMP®. There are numerous variations including the differential version shown here, as well as single-sided versions. The gm stages are controlled by a series of interpolator currents which are generally in the form of overlapping Gaussian current pulses which progressively enable and disable gm stages along the length of the attenuator to steer the output along the attenuator, thereby varying the gain.

In some applications, for example, an oscilloscope front end, the VGA may need to be optimized for low gain and high bandwidth. With an interpolated VGA, this would involve increasing the size of the transistors in the gm cells. Increasing the size of the transistors, however, presents additional problems such as an increase of the capacitance associated with each junction. This may result in feedthrough (or leakage) of high-frequency currents through the gm cells, a process sometimes referred to as "blow-by". The resulting structure may become unwieldy and ineffective.

FIG. 8 illustrates an embodiment of a VGA circuit according to some inventive principles of this patent disclosure. The embodiment of FIG. 8 includes an attenuator 76 that generates a series of progressively attenuated outputs in response to an input signal IN. A steering core 78 includes a series of low-inertia switches 80 that open or close in response to one or more control signals CTRL. In this example, the switches are arranged to steer the outputs from the attenuator to a common input of a main amplifier 82, but other configurations may be utilized. For example, in another embodiment, the steering core may be arranged to steer one or more input signals to one of multiple inputs to an attenuator. A single output from the attenuator may then be applied to a main amplifier or otherwise processed. The embodiment of FIG. 8 is shown as a single-sided structure, but differential versions are also contemplated according to some inventive principles of this patent disclosure. A differential embodiment may include multiple steering cores arranged to steer sets of signals from or to a differential attenuator.

Figure 9:
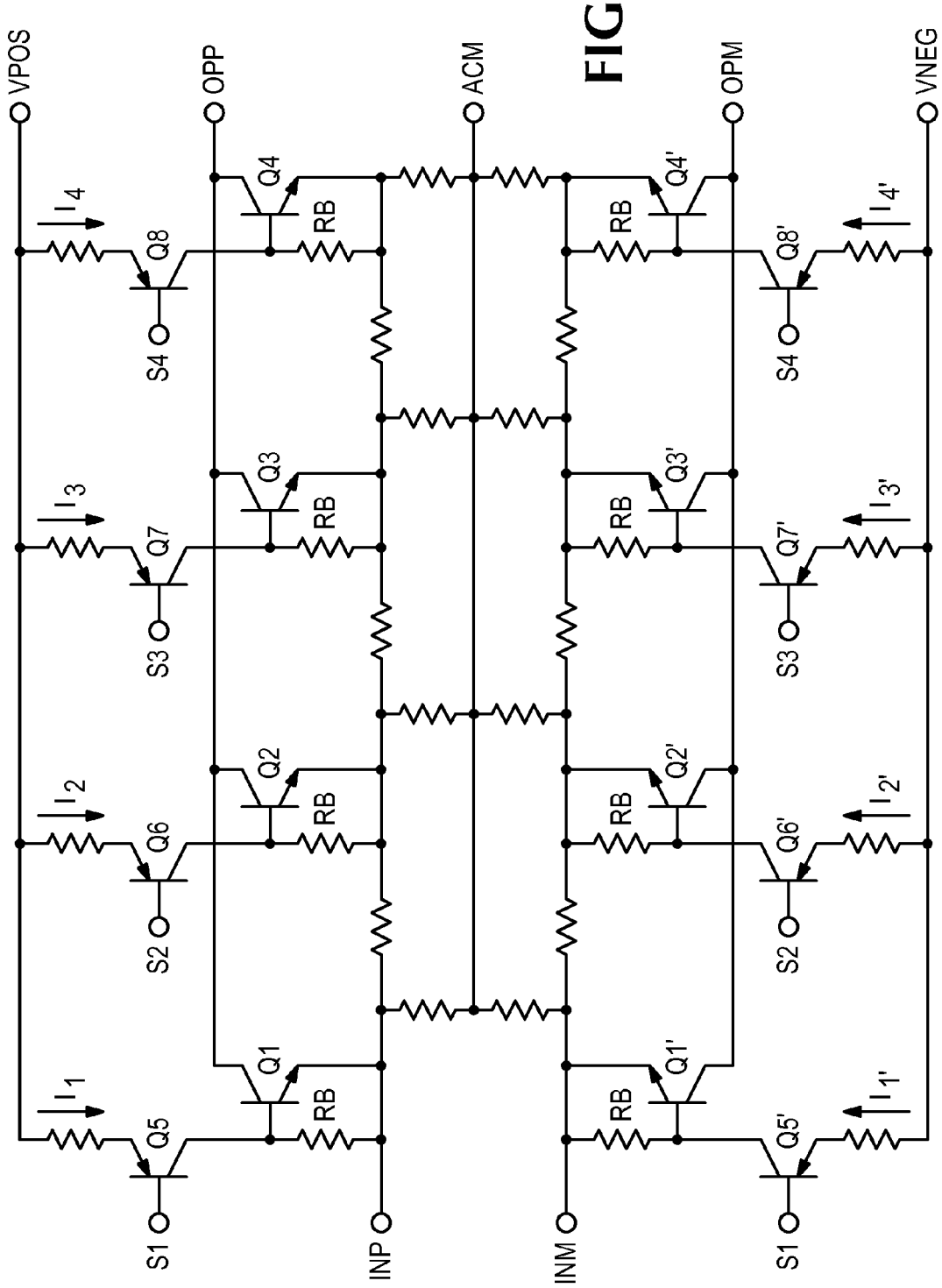
FIG. 9 illustrates another embodiment of a VGA circuit according to some inventive principles of this patent disclosure.

FIG. 9 illustrates another embodiment of a VGA circuit according to some inventive principles of this patent disclosure. The input signal is applied to the inputs INP,INM of a differential attenuator having a common mode terminal ACM. Pairs of silicon-on-insulator (SOI) transistors Q1,Q1' through Q4,Q4' are arranged to steer the signal from pairs of tap points to outputs OPP and OPM which may be connected to a main amplifier or other signal processing apparatus. The steering transistors are driven by programmable selection currents I1,I1' through I4,I4' which can be generated by any suitable source. In this example, the selection currents are generated by current source transistors Q5,Q5' through Q8,Q8' in response to gain select signals S1-S4. Base resistors RB prevent any leakage current from the current source transistors from turning on the steering transistors. The bases of the steering transistors could alternatively be connected directly to some type of ground node when they are off, but the use of base resistors may be adequate to prevent transference of any signal through to the outputs. Also, the other ends of the base resistors can alternatively be connected to ground, but this may cause the base resistors to become part of the attenuator, especially toward the output end.

By replacing the gm cells of a traditional interpolated VGA with low-inertia switches such as silicon-on-insulator (SOI) transistors, high bandwidth operation may be achieved without significant harmful effects such as feedthrough. Moreover, an SOI transistor can be operated in saturation to provide very low on resistance, but without causing large substrate currents because, in the case of an NPN switch, there is no substrate PNP associated with it.

The circuit of FIG. 9 may provide an overall lower inertia system than can be attained with gm cells, and further, a main amplifier may now be implemented as a low noise amplifier (LNA). The differential structure may help cancel the offsets caused by the switches and associated support circuitry, and the noise may be low due to the low on resistance of the switches.

The circuit of FIG. 9 may also be implemented as a single-ended circuit with only a single series of low-inertia switches. The steering action can be continuous, i.e., interpolated between tap points, or discrete switching between tap points can be used. The attenuator is shown as a ladder network, but other types of multi-tap attenuator networks can be utilized.

Main Amplifier

Figure 10:
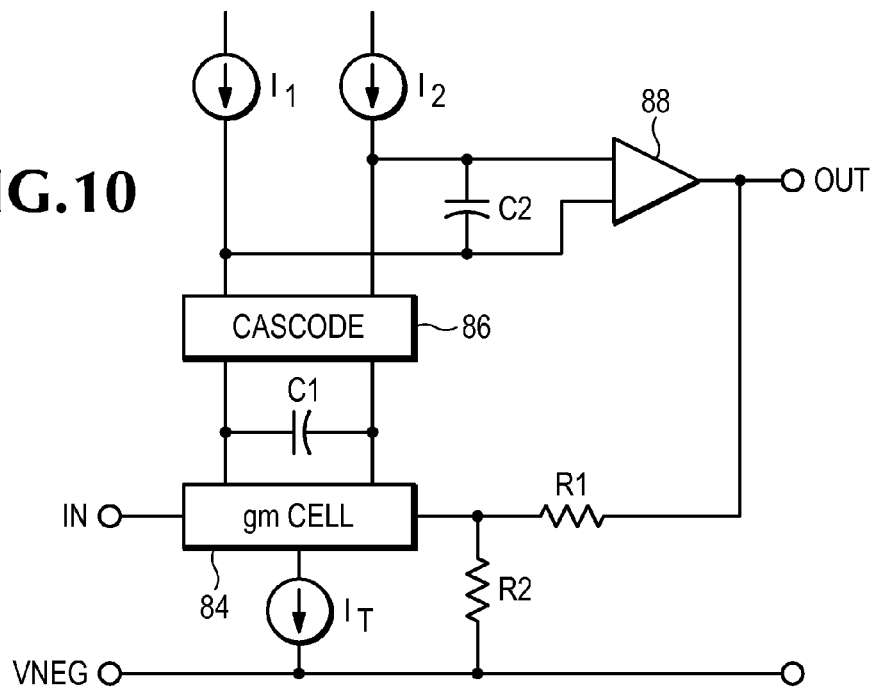
FIG. 10 illustrates an embodiment of a main amplifier for a VGA having a variable attenuator front end according to some inventive principles of this patent disclosure.

FIG. 10 illustrates an embodiment of a main amplifier for a VGA having a variable attenuator front end according to some inventive principles of this patent disclosure. The embodiment of FIG. 10 is shown as a single-ended circuit, but the inventive principles also contemplate differential embodiments. The input signal is applied to one input of a gm cell 84 that is biased by a tail current $I_T$. The gm cell is loaded by low-noise current sources $I_1$ and $I_2$ through a cascode stage 86. A differential amplifier 88 has a differential input connected to each side of the output from the cascode stage. The output is coupled back to the other input of the gm cell through feedback network R1,R2 which sets the overall amplifier gain.

The cascode stage reduces variations in the power dissipation between the transistors in the gm cell, thereby minimizing transient thermal effects. For example, during an input signal excursion of one polarity applied to the gm cell, one side of the gm cell carries more current. The cascode stage helps raise the voltage of the other side of the gm cell so that the power dissipated by the other side of the gm cell (determined by the product of voltage and current), is more nearly equal to that dissipated by the first side of the gm cell. The bias or anchor voltage for the cascode transistor can be set to a voltage that is determined experimentally to shift the power dissipation around to provide suitable thermal effects.

Capacitor C2 forms a first (or main) pole in the closed loop frequency response, while capacitor C1 forms a second (or auxiliary) pole in the closed loop frequency response. The capacitors can be implemented as switched or otherwise variable capacitors, and the tail current $I_T$ can be varied to provide integral filter control as described below.

The main amplifier of FIG. 10 is useful with any suitable input including any type of variable attenuator input, but especially one with an attenuator having low-inertia steering as described above.

Amplifier with Integral Filter Control

Variable gain amplifiers are commonly used as inputs to A/D converters. An anti-aliasing filter is typically required between the amplifier and the A/D converter. Prior art arrangements utilized a separate anti-aliasing filter which increases the cost and complexity of the system.

Some additional inventive principles of this patent disclosure relate to amplifiers having low pass or other filters that are integral with the main amplifier and provide a wide range of adjustment. The topology enables tuning of the pole locations to be accomplished by switching different capacitor values (e.g., for coarse adjustment) and by varying the bias current through the main amplifier (e.g., for fine adjustment).

The integration of the filter and main amplifier may provide a simplified and tightly integrated solution. Moreover, if an integral low pass filter arrangement is utilized in a series of cascaded gain stages, an anti-aliasing filter having a very high number of poles may be realized since each of the multiple gain stages may contributes one or two poles to the overall filtering operation. Also, the circuit topology may enable the use of a low-dropout current mirror (also know as a V-Mirror) as a load on the main amplifier, thereby providing a very high level of accuracy.

Figure 11:
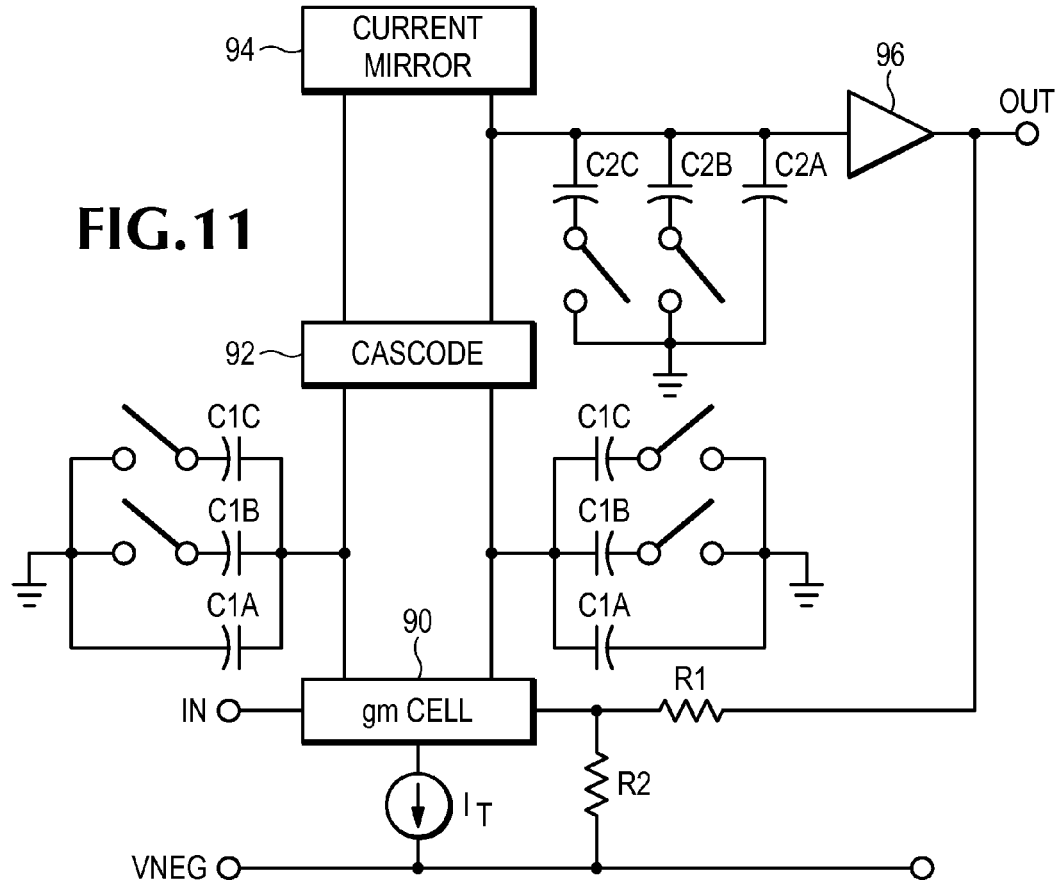
FIG. 11 illustrates an embodiment of an amplifier having integral filter control according to some inventive principles of this patent disclosure.

FIG. 11 illustrates an embodiment of an amplifier having integral filter control according to some inventive principles of this patent disclosure. The embodiment of FIG. 11 is based on the topology of FIG. 10, but here the capacitors are connected between one side of the signal path and a common point to facilitate switching of different capacitor values. The gm cell 90 is now loaded by a current mirror 94, and the output is taken from one side of the mirror and applied to a buffer amplifier 96.

Filter control can be provided through various techniques. First, capacitor values can be switched to change the low pass filter corner frequency. Second, capacitor values can be switched to change the Q of the system. Third, the tail current $I_T$ can be varied to provide an additional level of control because changing the tail current changes the electronic resistance $r_e$ (or "re") of the transistors in the gm cell, which alters the corner frequency. This can be used, for example, as fine control to interpolate between capacitor steps. Capacitors can be switched externally by bringing capacitor connections out to a terminal on an IC, or by using internal switches such as SOI switches, etc.

Figure 12:
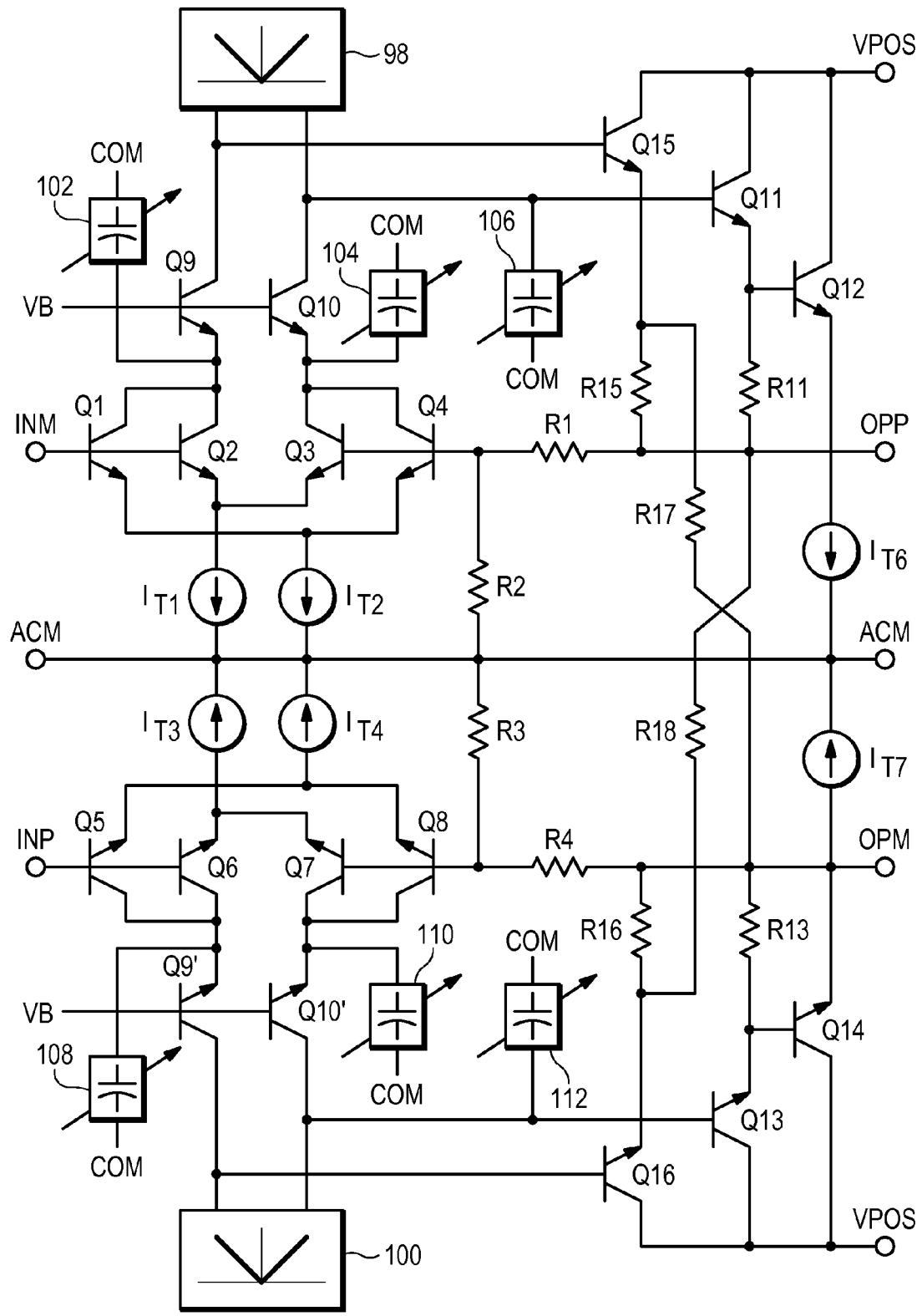
FIG. 12 illustrates another embodiment of an amplifier according to some inventive principles of this patent disclosure.

FIG. 12 illustrates another embodiment of an amplifier according to some inventive principles of this patent disclosure. The embodiment of FIG. 12 is fully differential about a common terminal ACM which can be set as an AC common mode node. The gm cells Q1-Q4 and Q5-Q8 are implemented as multi-tanh cells biased by current sources IT1-IT4. Cascode transistors Q9,Q10,Q9',Q10' are anchored to a bias voltage VB. The current minors 98 and 100 are implemented as V-Mirrors as shown below.

On the top half of the circuit, the buffer amplifier is formed by emitter follower transistors Q11 and Q12 which are biased by tail current IT6 and provide the final output OPP. Transistors Q13 and Q14 form the buffer on the bottom half of the circuit and are biased by current IT7. Resistors R1-R4 form the gain setting feedback network. The use of a V-Mirror is particularly beneficial when the buffer amplifiers are implemented as emitter followers because the voltage at the base of Q11, for example, must change considerably during operation. Such a voltage swing at the input to other types of current minors may cause inaccurate operation. The V-Mirror, however, minimizes such effects.

Switched or otherwise selectable capacitor networks 102 through 112 provide adjustable multi-pole filter control. The common terminals of the capacitor networks can be connected to the common mode terminal ACM or any other suitable point. Capacitor networks 102 and 104 are typically balanced for differential operation, are networks 108 and 110. Likewise, the capacitor networks on the top half of the circuit may be balanced with the corresponding networks on the bottom half of the circuit.

On the top half of the circuit, the capacitor network 106 works with the electronic emitter resistance re of the cascode stage to form a first pole. The capacitor networks 102 and 104 combine with the $r_e$s of the gm cell to form a second pole which may be at the same frequency as the first pole, but not at the origin. The first pole may have a form $1/sT_1$, while the second pole may have a form $1/(1+sT_2)$. Thus, the overall open loop response may be $1/[sT_1(1+sT_2)]$ and the poles can be moved around in the s-plane to provide a suitable response. The capacitor networks in the bottom half of the circuit provide a similar effect.

Each side of the circuit also includes an additional emitter follower stage. In the top half, this is transistor Q15 which is connected to the opposite side of the current mirror load from Q11. Transistor Q15 is loaded primarily by R15 which is made roughly equal to R11 which loads Q11. By connecting emitter followers to both sides of the current mirror, it reduces the differential current because both sides see similar effects from the followers. Resistors R17 and R18 are also included to cross-couple the outputs of Q15 and Q16 to opposite sides of the circuit to provide base current and a unique compensation scheme which is facilitated by the use of the V-Mirror.

Figure 13:
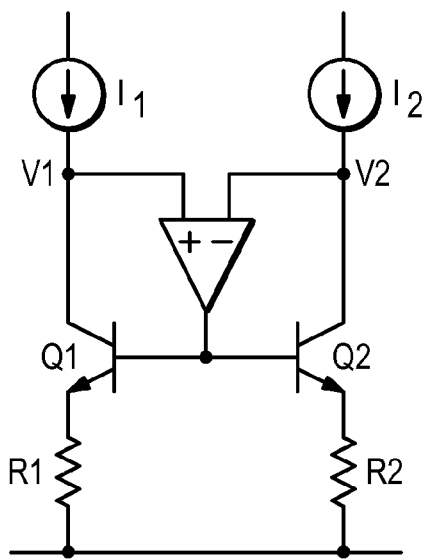
FIG. 13 illustrates a general embodiment of a low drop-out current minor.
Figure 13A:
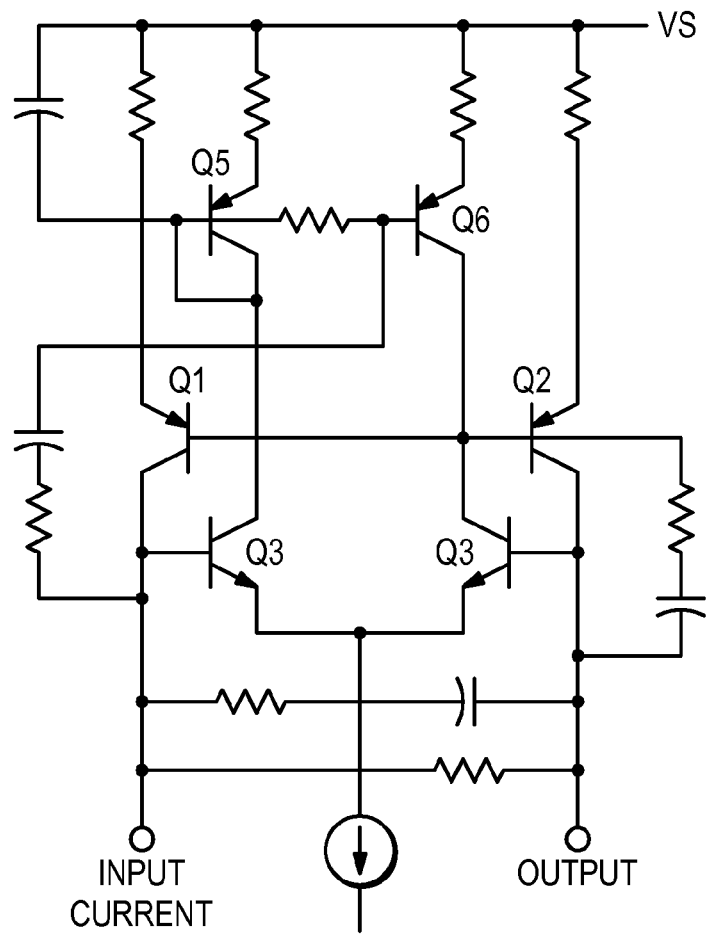
FIG. 13A illustrates an embodiment of a low drop-out current minor adapted for use with an amplifier according to some inventive principles of this patent disclosure.

FIG. 13 illustrates a general embodiment of a low drop-out current minor or V-Mirror. The general operation of this type of current mirror is described in U.S. Pat. No. 6,437,630 by the same inventor as the present application and incorporated by reference. FIG. 13A illustrates an embodiment of a V-Mirror adapted for use with an amplifier according to some inventive principles of this patent disclosure.

When the inventive principles described above with respect to FIGS. 10-14 are utilized in conjunction with a multi-stage front-end system such as that shown above in FIGS. 5-7, it may provide progressive filtering along the signal chain as is consistent with minimizing nonlinear artifacts. In some other embodiments, the filters can be implemented as pure-RC types rather than some variant of gm/C topology in order to minimize out-out-band distortion (artifacts due to large high frequency signals causing intermodulation). Two stages may provide programmable conjugate-pole-pairs, or an overall 4-pole response, and in some embodiments, the response may be made maximally flat in the time domain.

Figure 14:
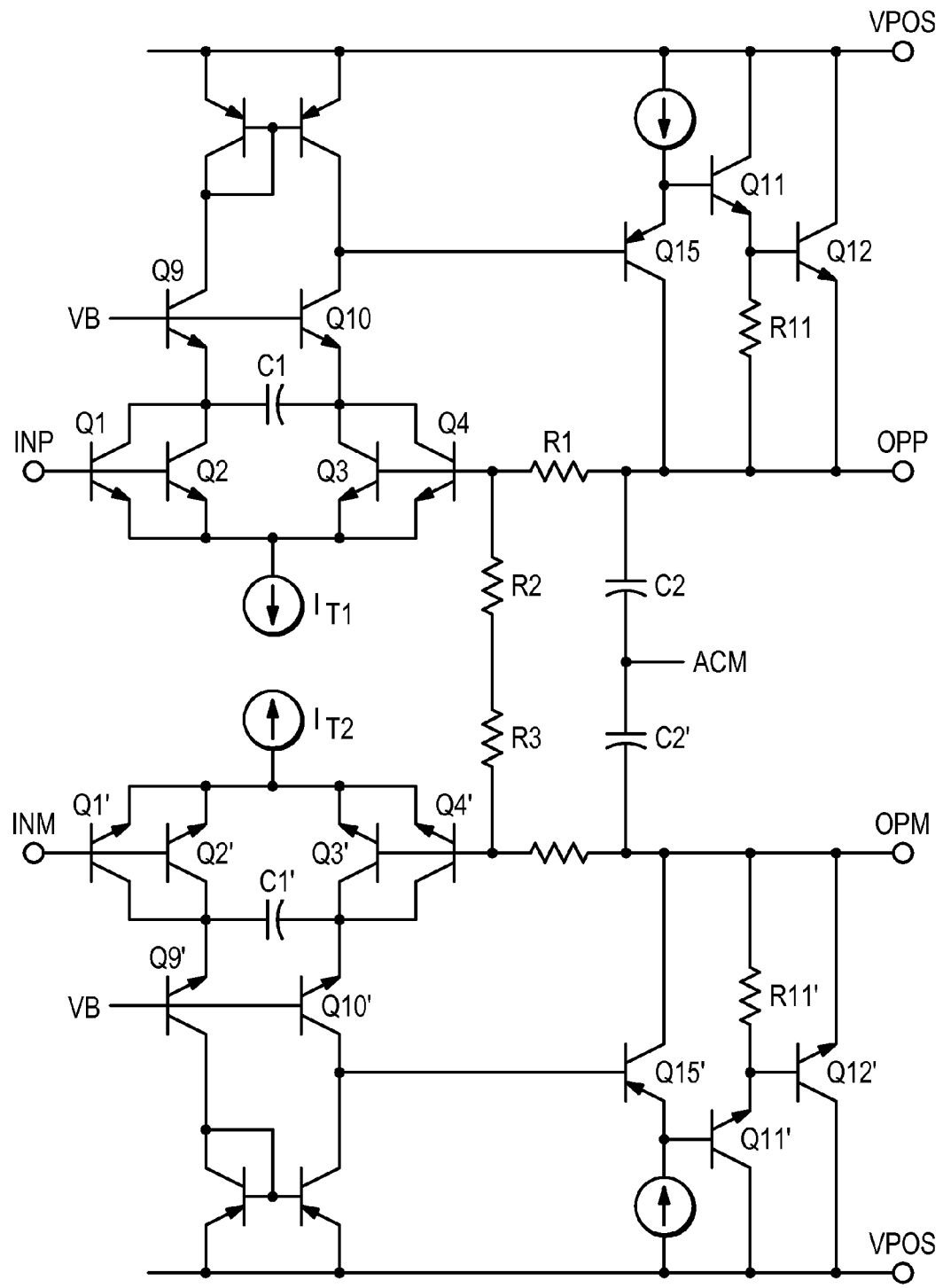
FIG. 14 illustrates another embodiment of an amplifier having integral filter control according to some inventive principles of this patent disclosure.

FIG. 14 illustrates another embodiment of an amplifier having integral filter control according to some inventive principles of this patent disclosure. In this embodiment, the filter control is provided entirely by varying the bias current through the gm cells. As the tail currents IT1 and IT2 are varied, the $r_e$ of the transistors in the gm cell and cascode stage change. Since capacitor C1 forms a time constant with the $r_e$ of the gm cell, and capacitor C2 forms a time constant with the $r_e$ of the cascode stage, the corner frequency varies as the tail currents change.

Different variants of the amplifier of FIG. 14 may be used at various positions along a cascade of attenuator and gain stages as shown in FIGS. 5-7. Using the embodiment of FIG. 7 as an example, the amplifier of FIG. 14 may be used for the first stage, but with no filter capacitors, and therefore, it provides no significant contribution to the low pass filtering along the signal chain. Another instance of the amplifier of FIG. 14 may be used for the second fixed gain stage, but in this stage, both of capacitors are included to provide two poles to the overall signal chain. Yet another instance of the amplifier of FIG. 14 may be used for the third fixed gain stage, but in this stage, one set of capacitors are included to provide a third pole to the overall signal chain. In the final stage, another amplifier having no capacitors may be used. Thus, the system has an overall three-pole response with the poles distributed throughout in a manner that may be most beneficial to the particular implementation. In another embodiment the second and third amplifiers may contribute two poles each for a total of four poles. In other embodiments, any number of poles may be distributed anywhere throughout the entire signal path.

Figure 15:
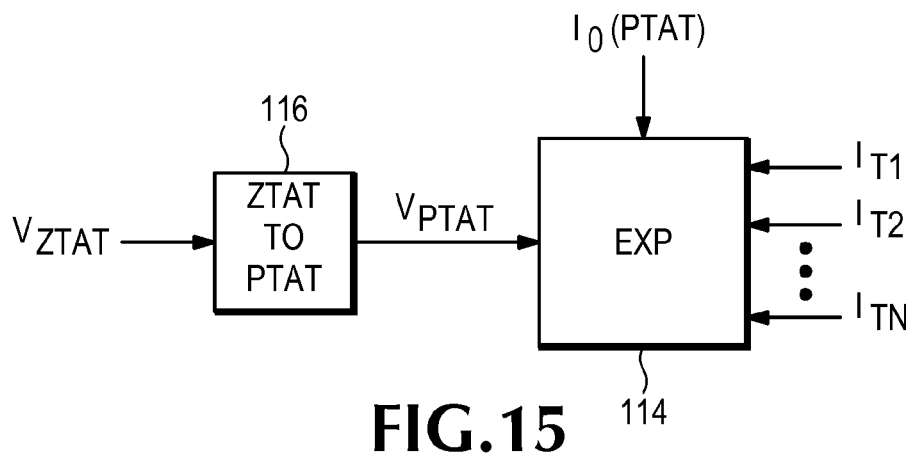
FIG. 15 illustrates an embodiment of a circuit for generating variable tail currents according to some inventive principles of this patent disclosure.

FIG. 15 illustrates an embodiment of a circuit for generating variable tail currents to vary the roll-off frequencies of the amplifiers with integral filtering described above. The embodiment of FIG. 15 includes an exponential current generator 114 to multiple tail currents IT1, IT2, etc. having an exponential characteristic to provide linear-in-dB control of the filter frequency. The exponential current generator may be based on the principles described in U.S. Pat. No. 5,572,166 titled Linear-in-decibel Variable Gain Amplifier by the same inventor as the present patent disclosure. In this embodiment, the generator 114 generates the tail currents in response to a reference signal $I_0$ that is proportional to absolute temperature (PTAT), and a control signal $V_{PTAT}$. A user applies an analog control signal $V_{ZTAT}$, which is stable with temperature (has a zero temperature coefficient, also referred to as ZTAT), to a ZTAT-to-PTAT converter 116 which converts the signal to PTAT form for use by the exponential current generator 114.

Figure 16:
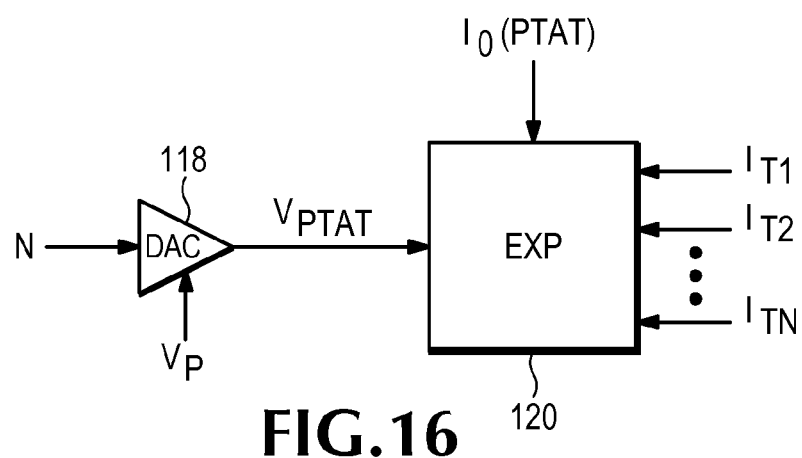
FIG. 16 illustrates a digital version of a circuit for generating the variable tail currents according to some inventive principles of this patent disclosure.

FIG. 16 illustrates a digital version of a circuit for generating the variable tail currents. In this embodiment, the user inputs a digital word N to a DAC 118 which is supplied with a PTAT reference signal $V_P$. The output of the DAC is thus in PTAT form which may be used by an exponential current generator 120 to generate the multiple tail currents IT1, IT2, etc.

Output Centering

Figure 17:
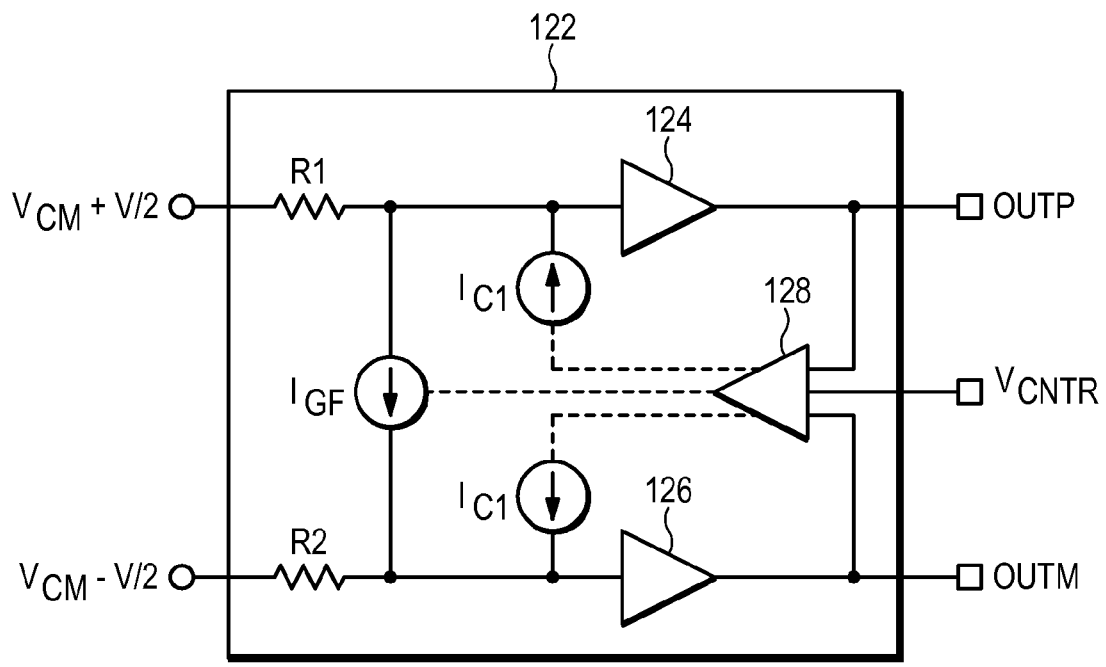
FIG. 17 illustrates an embodiment of a centering circuit according to some inventive principles of this patent disclosure.

FIG. 17 illustrates an embodiment of a centering circuit according to some inventive principles of this patent disclosure. In the embodiment of FIG. 17, the input signal includes a differential component V and a common mode component $W_{CM}$. Thus, the signal $V_{CM}+V/2$ is applied to one side of gain stage 122, and $V_{CM}-V/2$ is applied to the other. In this example, the gain stage 122 is assumed to be a final 0 dB (i.e., gain of one) stage at the end of a cascade of attenuators and gain stages for driving an ADC, but the principles apply to any type of gain stage. Unity gain buffers 124 and 126 provide a relatively high current drive capability to drive the ADC. The final output for the ADC is provided at pads or terminals OUTP and OUTM.

Another pad or terminal enables a user to apply a centering voltage $V_{CNTR}$ which is used by an op amp 128 to control two current sources IC1, each of which sources an identical current to one side of the signal path, and an additional current source $I_{GF}$ which supplies a differential current between the two sides.

By injecting identical currents into both sides of the signal path, the current sources IC1 force the entire output up or down, thereby centering the output at the level selected by the user through $V_{CNTR}$. In contrast, the gain correction current $I_{GF}$ eliminates any small differences that may exist in the balance between the input signals to the gain stage 122.

FIG. 18 illustrates another embodiment of a centering circuit according to some inventive principles of this patent disclosure. In the embodiment of FIG. 18, the centering circuit does not include any gain stages or buffers, but instead, may be appended to the end of a cascade of attenuator and gain stages as shown in FIGS. 5-7. The inputs INP and INM are received at the preceding gain stage 129, while the final output signals are provided at OUTP and OUTM. An op amp 130 drives the center point of the gain setting resistor network R1-R4 in the preceding gain stage to force the center point of the output, as measured with R5 and R6, to equal the centering signal $V_{CNTR}$.

A characteristic of a chain of gain stages based on the instrumentation amplifier topology shown for the preceding gain stage 129 in FIG. 18, as well as the embodiments of FIGS. 10-12 and 15, is that the common mode rejection (CMR) of the entire chain of gain stages may be the same as the CMR for one stage if all of the gain was provided by one stage. Thus, an embodiment may obtain the benefit of spreading the gain across multiple gain stages while not paying a CMR penalty.

FIG. 19 illustrates an embodiment of an op amp suitable for use as the op amp 130 in the centering circuit of FIG. 18. A gm core Q7 and Q8 are loaded by a Wilson current mirror Q1-Q4. R2 equalizes the collector voltages to minimize $\Delta V_{BE}$. Transistors Q9 and Q10 sense the voltage difference between the bases of Q7 and Q8 and arranged such that the current in Q9 increases in proportion to the current in Q8, while the current in Q10 increases in proportion to the current in Q7. The current in Q9 and 10 is applied to input transistors Q5 and Q6. The $\Delta V_{BE}$ across Q5 and Q6 responds to the reverse of the $\Delta V_{BE}$ Q7 and Q8. Thus, the differential voltage required at the inputs INP and INM may be greatly reduced—perhaps almost to zero under much of the operating range.

The embodiments described herein can be modified in arrangement and detail without departing from the inventive concepts. For example, some of the principles have been described above in the context of an analog front-end for an instrumentation system, such as an oscilloscope or ultrasound system, where they work together synergistically to provide a comprehensive solution tailored to the unique characteristics of the system. Nonetheless, the principles also have utility separately, and in other applications. Many numerical examples have been provided to facilitate explanation of the inventive principles, for example, 1MΩ resistors with 1% tolerance, but the inventive principles are not limited to any such specific examples. As another example, many embodiments have been illustrated with BJT or FET transistors of specific polarities, but other types of devices may be used. Accordingly, such changes and modifications are considered to fall within the scope of the following claims.

The invention claimed is:

1. An input stage for an instrumentation system, the input stage comprising:
  an input terminal to receive a signal to be measured by the instrumentation system;
  a summing node;
  a resistor coupled between the input terminal and the summing node;
  an amplifier arranged to maintain the voltage at the summing node; and
  a clamp circuit directly connected to the summing node.

2. The input stage of claim 1 further comprising a feedback network coupled between an output of the amplifier and the summing node.

3. An input stage for an instrumentation system, the input stage comprising:
- an input terminal to receive a signal to be measured by the instrumentation system;
- a summing node;
- a resistor coupled between the input terminal and the summing node;
- an amplifier arranged to maintain the voltage at the summing node; and
- a slideback circuit directly connected to the summing node.

4. The input stage of claim 3 wherein the slideback circuit comprises a variable current source.

5. The input stage of claim 3 wherein the slideback circuit comprises:
- a digital-to-analog converter; and
- a resistor coupled between an output of the digital-to-analog converter and the summing node.

6. The amplifier of claim 1 where the input terminal is not directly connected to a clamp circuit.

\* \* \* \* \*

UNITED STATES PATENT AND TRADEMARK OFFICE
CERTIFICATE OF CORRECTION

PATENT NO. : 8,451,052 B2  
APPLICATION NO. : 13/330388  
DATED : May 28, 2013  
INVENTOR(S) : Barrie Gilbert Page 1 of 1

It is certified that error appears in the above-identified patent and that said Letters Patent is hereby corrected as shown below:

Title page, item [57] line 3 in the abstract, the words "in anther embodiment" should be replaced with -- in another embodiment --

In the Specification  
Column 2, lines 13, the word "minor" should be replaced with -- mirror --  
Column 2, lines 16, the word "minor" should be replaced with -- mirror --  
Column 9, line 27, the word "know" should be replaced with -- known --  
Column 9, line 58, the word "minor" should be replaced with -- mirror --  
Column 10, line 3, the word "minor" should be replaced with -- mirror --  
Column 10, line 37, the word "minor" should be replaced with -- mirror --

Signed and Sealed this  
Fifth Day of November, 2013

Teresa Stanek Rea  
*Deputy Director of the United States Patent and Trademark Office*